United States Patent
Kuroda

(10) Patent No.: US 9,810,961 B2
(45) Date of Patent: Nov. 7, 2017

(54) LIGHT EMITTING SYSTEM

(71) Applicant: Pioneer Corporation, Kawasaki-shi, Kanagawa (JP)

(72) Inventor: Kazuo Kuroda, Kawasaki (JP)

(73) Assignee: PIONEER CORPORATION, Kawasaki-Shi, Kanagawa (JP)

(*) Notice: Subject to any disclaimer, the term of this patent is extended or adjusted under 35 U.S.C. 154(b) by 0 days.

(21) Appl. No.: 14/763,137

(22) PCT Filed: Jan. 25, 2013

(86) PCT No.: PCT/JP2013/051626
§ 371 (c)(1),
(2) Date: Jul. 23, 2015

(87) PCT Pub. No.: WO2014/115313
PCT Pub. Date: Jul. 31, 2014

(65) Prior Publication Data
US 2015/0370100 A1    Dec. 24, 2015

(51) Int. Cl.
*G02F 1/1335*    (2006.01)
*G02F 1/137*    (2006.01)
(Continued)

(52) U.S. Cl.
CPC ........ *G02F 1/137* (2013.01); *G02F 1/133528* (2013.01); *H01L 51/50* (2013.01); *E06B 2009/2464* (2013.01); *G09G 3/3406* (2013.01)

(58) Field of Classification Search
CPC .. G02F 1/137; G02F 1/133528; G02F 1/1336; H01L 51/50; E06B 2009/2464; G09G 3/3406
See application file for complete search history.

(56) References Cited

U.S. PATENT DOCUMENTS

2006/0050216 A1* 3/2006 Joten ................ G02F 1/133528
349/117
2006/0221280 A1* 10/2006 Oka .................. G02F 1/133634
349/117
(Continued)

FOREIGN PATENT DOCUMENTS

JP    2000-199382    7/2000
JP    2005-191015    7/2005
(Continued)

OTHER PUBLICATIONS

English machine translation of Japanese patent publication JP 2012-155416 A; published Aug. 2012; Author: Moribe, Mineo.*
(Continued)

*Primary Examiner* — Nicholas Lee
*Assistant Examiner* — Gerald Oliver
(74) *Attorney, Agent, or Firm* — Procopio, Cory, Hargreaves & Savitch LLP

(57) ABSTRACT

A light emitting system 10 includes a light source (100), a light transmission quantity adjustment unit (200), and a control unit (300). The light source (100) may be a fluorescent lamp or an electric bulb, and may be an Organic Electroluminescence (EL) element or a Light Emitting Diode (LED) element. The light transmission quantity adjustment unit (200) is arranged with a space (S) from the light source (100), and adjusts a light transmission quantity. The control unit (300) controls the light transmission quantity adjustment unit (200) based on a timing at which the light source (100) emits light.

6 Claims, 8 Drawing Sheets

(51) Int. Cl.
  *H01L 51/50*   (2006.01)
  *G09G 3/34*    (2006.01)
  *E06B 9/24*    (2006.01)

(56) References Cited

U.S. PATENT DOCUMENTS

2007/0211013 A1* 9/2007 Uehara .............. G09G 3/3413
                                                    345/102
2015/0350633 A1* 12/2015 Fang ................ H04N 13/0454
                                                    349/15

FOREIGN PATENT DOCUMENTS

| JP | 2007-265984 | 10/2007 | | |
|----|-------------|---------|---|---|
| JP | 2012155146 A | * | 8/2012 | .............. G09G 5/00 |

OTHER PUBLICATIONS

International Search Report for PCT/JP2013/051626, dated Apr. 23, 2013.

* cited by examiner

LIGHT EMITTING SYSTEM

TECHNICAL FIELD

The present invention relates to a light emitting system.

BACKGROUND ART

A light source, for example, has been used in various scenes as an illuminating device. In addition, recently, an Organic Electroluminescence (EL) element or a Light Emitting Diode (LED) has been increasingly used as a light source of a light emitting device.

For example, Patent Document 1 discloses that an organic layer is used as an example of a light emitting layer of a light emitting panel. Further, Patent Document 1 discloses that optical films are disposed on both surfaces of the light emitting panel from which light is emitted. In the optical films, polarization directions of light to be transmitted are orthogonal to each other. Accordingly, it is disclosed that a background of the light emitting panel is able to be prevented from being transparently viewed through.

In addition, in Patent Document 2, a display device is disclosed in which a transmissive liquid crystal panel is arranged on a light source which includes a red LED, a green LED, and a blue LED. Further, Patent Document 2 discloses that, when light emission intensity of the LED is calibrated, the red LED, the green LED, and the blue LED are subjected to time division and are driven.

RELATED DOCUMENT

Patent Document

[Patent Document 1] Japanese Unexamined Patent Application Publication No. 2005-191015
[Patent Document 2] Japanese Unexamined Patent Application Publication No. 2007-265984

SUMMARY OF THE INVENTION

The light source is sometimes used as illumination of a certain space. In such a case, a window is usually disposed in the space. However, it may be required that the light from the light source is not leaked to the outside of the window. In general, the window is covered with a shielding object such as a window shade or a curtain, and thus the leakage of the light is suppressed. However, labor is required for moving the shielding object.

An example of an object of the present invention is to suppress leakage of light from the window without moving the shielding object.

The invention according to claim 1 is a light emitting system including a light source, a light transmission quantity adjustment unit which is arranged with a space from the light source, and adjusts a light transmission quantity, and a control unit which controls the light transmission quantity adjustment unit based on a timing at which the light source emits light.

BRIEF DESCRIPTION OF THE DRAWINGS

The object described above, and other objects, characteristics, and advantages will become more obvious with reference to the following preferred embodiment and the following drawings attached thereto.

DESCRIPTION OF EMBODIMENTS

Figure 1:
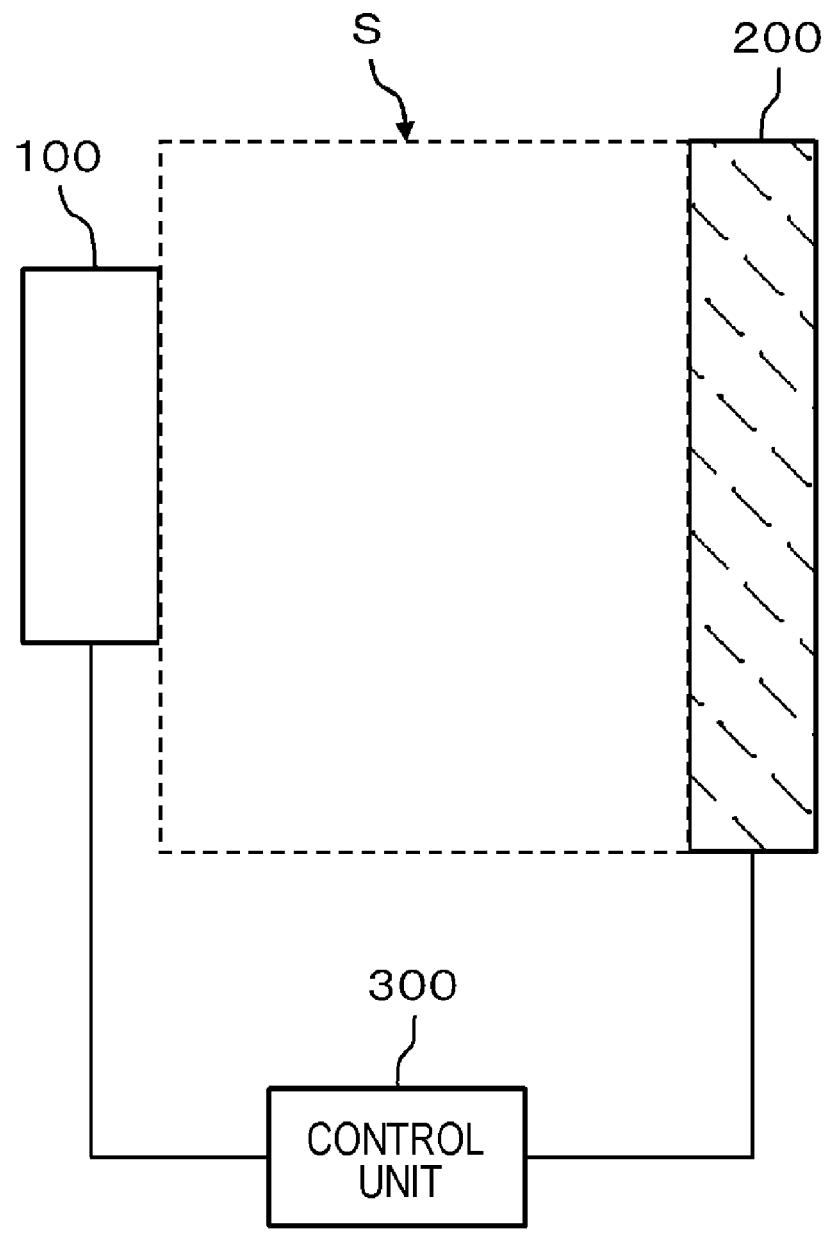
FIG. 1 is a diagram illustrating a configuration of a light emitting system according to an embodiment.

Hereinafter, an embodiment of the present invention will be described with reference to the drawings. Furthermore, in all of the drawings, the same reference numerals are applied to the same constituent parts, and the description thereof will not be repeated.

Furthermore, in the following description, a control unit 300 does not have a configuration of a hardware unit, and illustrates a block of a functional unit. Each constituent of the control unit 300 is realized by a CPU of an arbitrary computer, a memory, a program which is loaded in the memory and realizes the constituent illustrated in this drawing, a storage medium such as a hard disk which stores the program, and an arbitrary combination of hardware and software based an interface for network connection. Then, a realizing method and a device thereof include various modification examples.

FIG. 1 is a diagram illustrating a configuration of a light emitting system 10 according to an embodiment. The light emitting system 10 according to the embodiment includes a light source 100, a light transmission quantity adjustment unit 200, and a control unit 300. The light transmission quantity adjustment unit 200 is arranged with a space S from the light source 100, and adjusts a light transmission quantity. The control unit 300 controls the light transmission quantity adjustment unit 200 based on a timing at which the light source 100 emits light.

The light source 100 is used in order to illuminate the space S. The space S is a space into which a person enters, and for example, is the inside of a structure such as a building, a car, an electric train, or an airplane. It is preferable that the light source 100 is an Organic Electroluminescence (EL) element, a Light Emitting Diode (LED) element, or the like in which light emission and non-light emission are switched in a comparatively short period of time.

The light transmission quantity adjustment unit 200, for example, is disposed in at least a part of a window of the structure. The light transmission quantity adjustment unit 200, for example, includes a liquid crystal. In this case, the light transmission quantity adjustment unit 200 controls an alignment direction of the liquid crystal, and thus a light transmission quantity of the light transmission quantity adjustment unit 200 is controlled. However, the light transmission quantity adjustment unit 200 may control the light transmission quantity by using other methods, for example, a shutter which is driven by a Micro Electro Mechanical System (MEMS).

According to this embodiment, the control unit 300 controls the light transmission quantity adjustment unit 200 based on the timing at which the light source 100 emits the light. For this reason, the light transmission quantity adjustment unit 200 is able to change the light transmission quantity emitted by the light source 100. Accordingly, when the light transmission quantity adjustment unit 200 is attached to the window of the structure, it is possible to suppress leakage of the light from the light source 100 without moving a shielding object such as a window shade or a curtain, and it is possible to look at the outside from the inside.

EXAMPLE

Example 1

Figure 2:
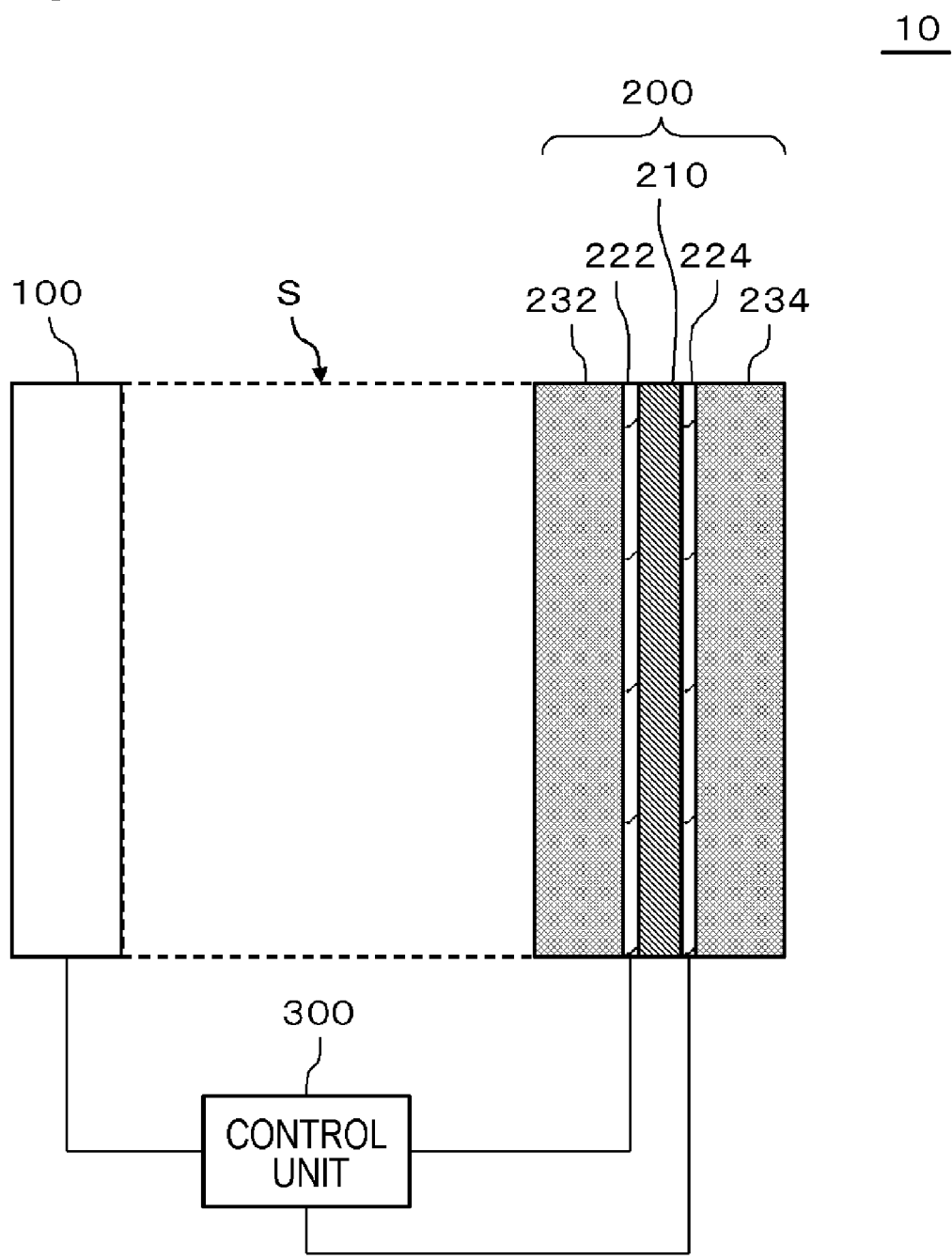
FIG. 2 is a diagram illustrating a configuration of a light emitting system according to Example 1.

FIG. 2 is a diagram illustrating a configuration of the Light emitting system 10 according to Example 1. In the light emitting system 10 according to this example, the light transmission quantity adjustment unit 200 includes a liquid crystal layer 210 and polarization units 232 and 234. The liquid crystal layer 210 is positioned between the polarization units 232 and 234. A polarization direction of the polarization unit 232 is orthogonal to the polarization direction of the polarization unit 234. In addition, the liquid crystal layer 210 is interposed between a first electrode 222 and a second electrode 224. Then, the first electrode 222 and the second electrode 224 are connected to the control unit 300. Thus, the alignment direction of the liquid crystal in the liquid crystal layer 210 is controlled by the control unit 300.

Figure 3:
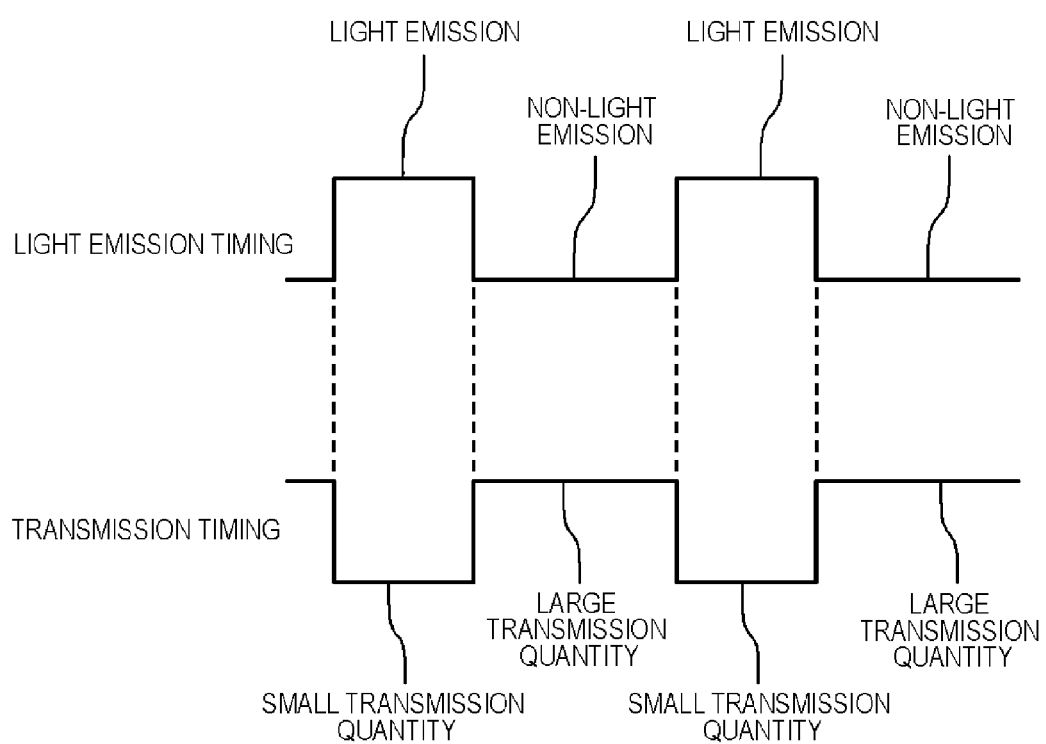
FIG. 3 is a diagram illustrating a first example of controlling a light transmission quantity adjustment unit by a control unit.

FIG. 3 is a diagram illustrating a first example of controlling the light transmission quantity adjustment unit 200 by the control unit 300. The control unit 300 allows the light transmission quantity of the light transmission quantity adjustment unit 200 when the light source 100 is emitting light to be different from the light transmission quantity of the light transmission quantity adjustment unit 200 when the light source 100 is not emitting light. In an example of this drawing, the control unit 300 decreases the light transmission quantity of the light transmission quantity adjustment unit 200 (preferably, to be a minimum value, for example, less than or equal to 5%) at a timing of emitting the light by the light source 100, and increases the light transmission quantity of the light transmission quantity adjustment unit 200 (preferably, to be maximized) at a timing other than the timing of emitting the light. According to this, at a timing at which the light source 100 does not emit the light, the person is able to recognize the background of the light source 100 from both of a first surface side and a second surface side of the light transmissive substrate 110. In addition, it is possible to prevent the light from the light source 100 from being emitted to the first surface side of the light transmissive substrate 110, and thus the person on the first surface side of the light transmissive substrate 110 will be hardly conscious of the existence of the light source 100.

Further, when the light source 100 is blinked at higher than or equal to 30 Hz, the person on the second surface side of the light transmissive substrate 110 is able to recognize that the light source 100 continuously emits the light. Furthermore, it is preferable that a blinking cycle is further accelerated.

Figure 4:
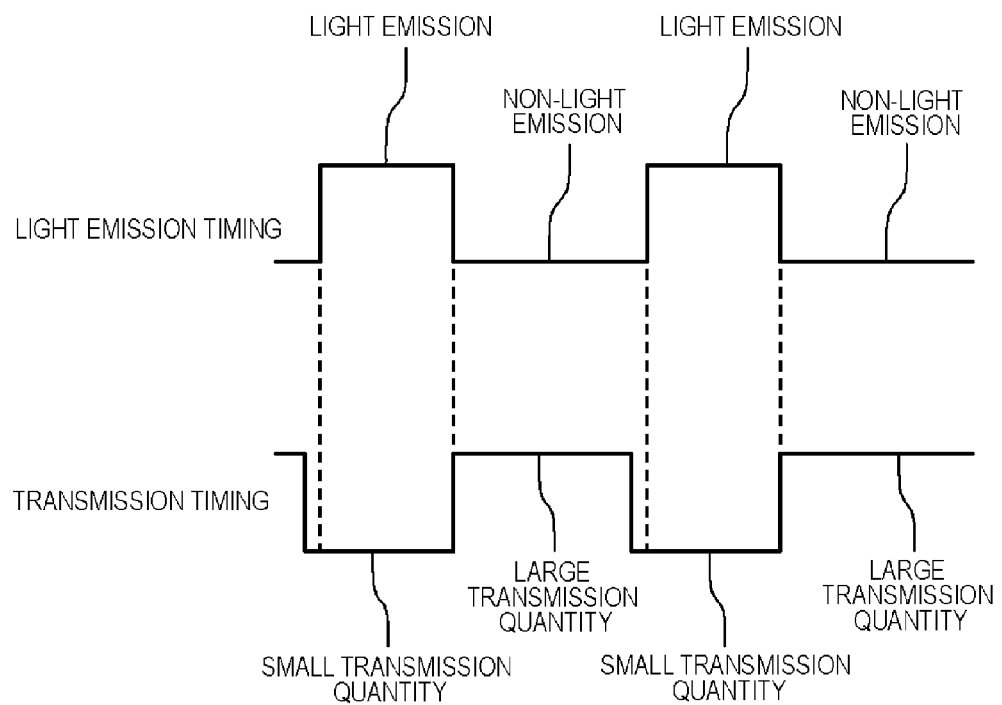
FIG. 4 is a diagram illustrating a second example of controlling the light transmission quantity adjustment unit by the control unit.

FIG. 4 is a diagram illustrating a second example of controlling the light transmission quantity adjustment unit 200 by the control unit 300. An example of this drawing is identical to the example illustrated in FIG. 3 except that the control unit 300 decreases the light transmission quantity of the light transmission quantity adjustment unit 200 (preferably, to be a minimum value, for example, less than or equal to 5%) before a timing of starting the light emission of the light source 100. According to this, for example, even when a period of time is required after a signal is input and before the alignment direction of the liquid crystal is changed, it is possible to prevent the light from being emitted from the second surface side of the light transmissive substrate 110.

According to this example, the light transmission quantity adjustment unit 200 includes the liquid crystal layer 210 and the polarization units 232 and 234. For this reason, the control unit 300 is able to easily control light transmittance of the light transmission quantity adjustment unit 200.

Example 2

Figure 5:
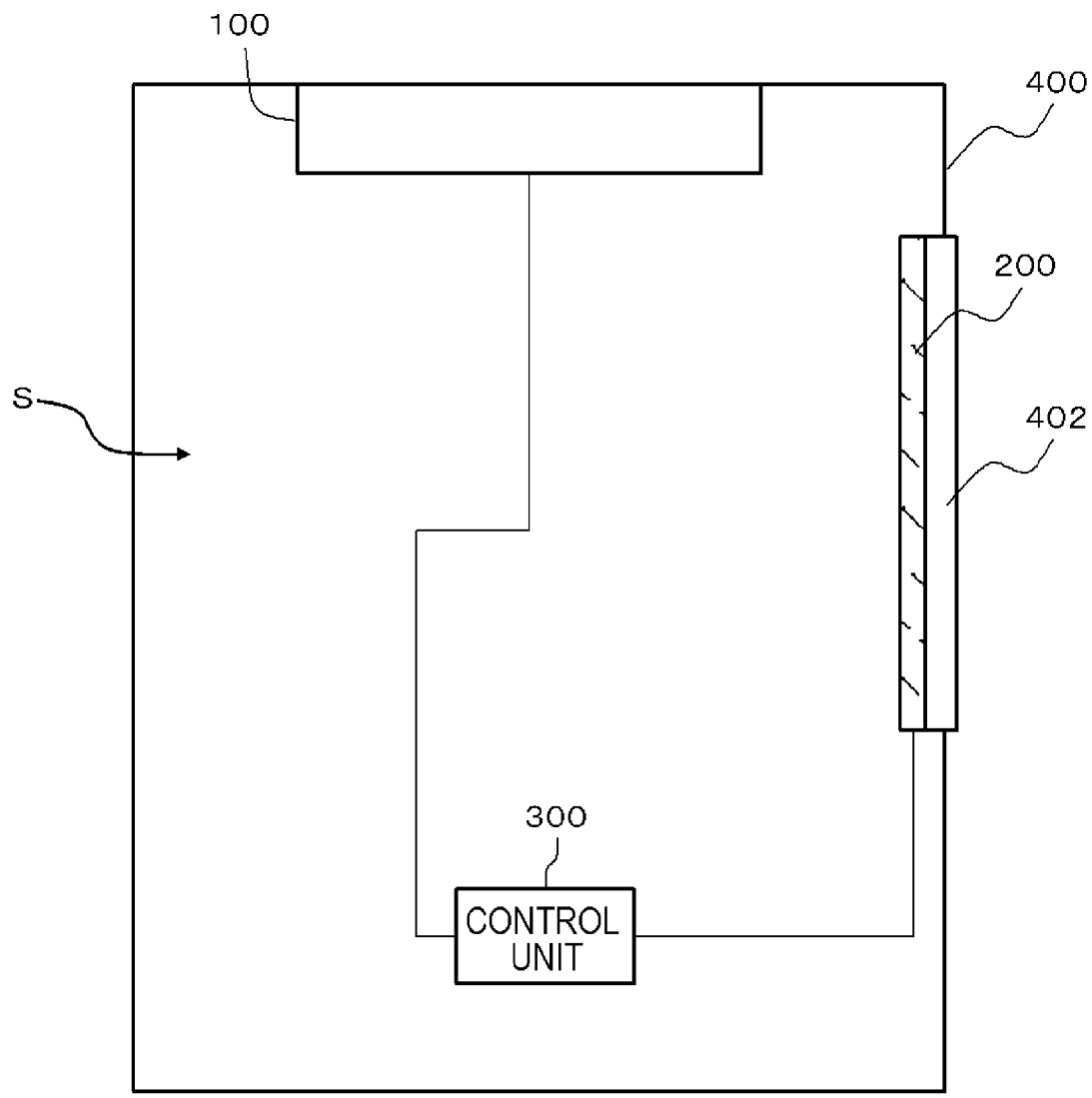
FIG. 5 is a diagram illustrating a configuration of a light emitting system according to Example 2.

FIG. 5 is a diagram is a configuration of the light emitting system 10 according to Example 2. In the light emitting system 10 according to this example, the light source 100 is positioned in a structure 400, for example, in a room of a building. In an example of this drawing, the light source 100 is attached to an inner wall of the room, for example, to a ceiling. In addition, the light transmission quantity adjustment unit 200 overlaps a window 402 of the structure 400. Furthermore, when a plurality of windows 402 is disposed in the structure 400, the light transmission quantity adjustment unit 200 may overlap with all of the plurality of windows 402, and the light transmission quantity adjustment unit 200 may overlap with only a part of the windows 402. Then, the control unit 300 may collectively control a plurality of light transmission quantity adjustment units 200. Furthermore, the control unit 300 may be arranged inside the structure 400, or may be arranged outside the structure 400. Furthermore, it is preferable that the light transmission quantity adjustment unit 200 overlaps with a surface of the window 402 which is directed towards the inside of the structure 400.

Figure 6:
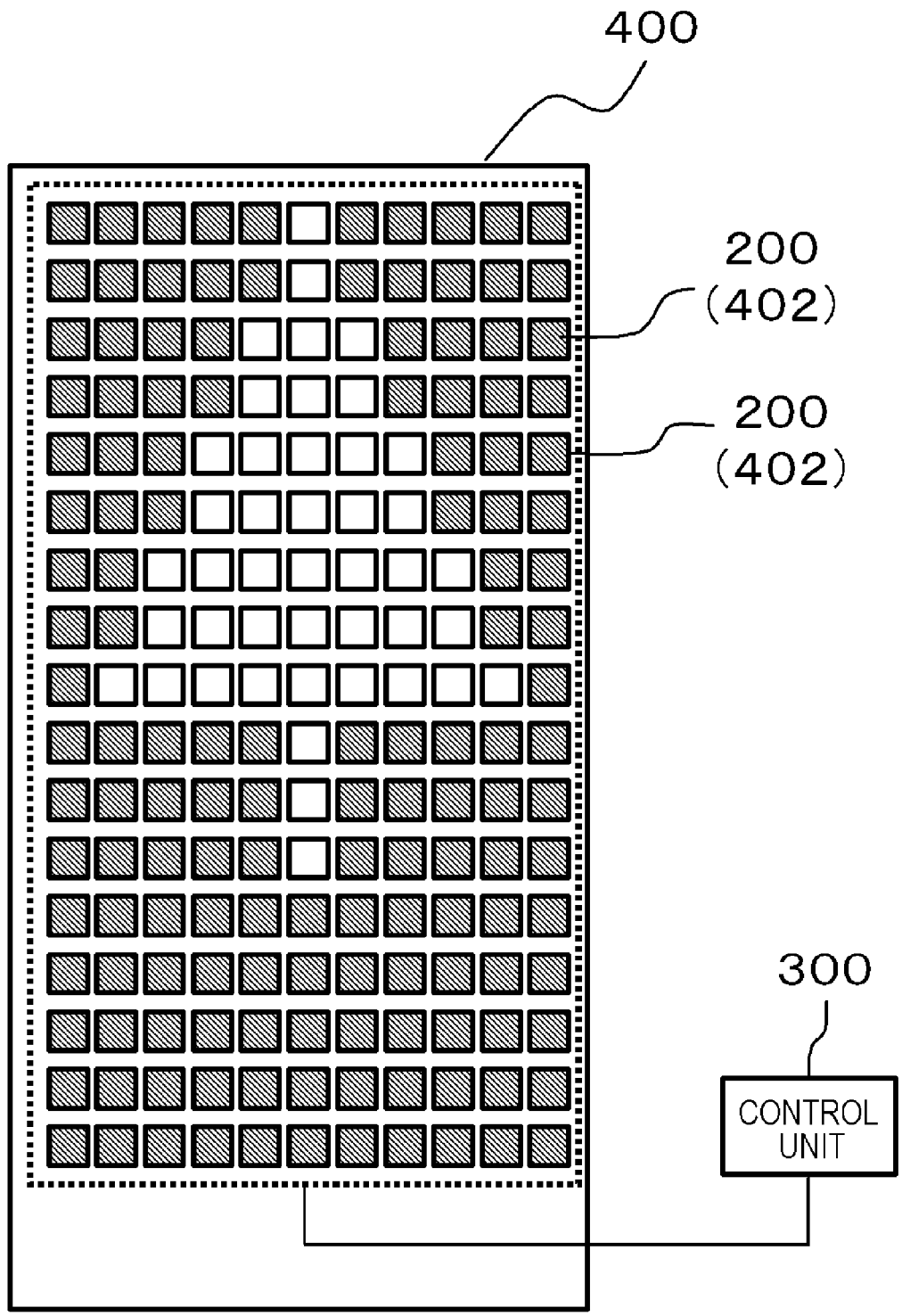
FIG. 6 is a diagram illustrating an example of a case where the control unit collectively controls a plurality of light transmission quantity adjustment units.

FIG. 6 is an example of a case where the control unit 300 collectively controls the plurality of light transmission quantity adjustment units 200. In an example of this drawing, the structure 400 is a building, and includes the plurality of windows 402 on a side surface. Then, in a case where brightness of the outside is less than or equal to a reference value, such as night, the control unit 300 controls the plurality of light transmission quantity adjustment units 200, and thus displays a picture or a character on the side surface of the structure 400. Furthermore, the control unit 300 may constantly decrease the light transmission quantity of the light transmission quantity adjustment unit 200 with respect to a window through which the light is not desired to leak to the outside among the windows 402. In addition, the control unit 300 may decrease the light transmission quantity of the light transmission quantity adjustment unit 200 at the timing of emitting the light by the light source 100, and may increase the light transmission quantity of the light transmission quantity adjustment unit 200 at a timing other than the timing of emitting the light. In the latter case, the person inside the structure 400 is able to look at the outside scenery from the window 402.

Furthermore, when the brightness of the outside is greater than or equal to a reference, the control unit 300 may allow all of the light transmission quantity adjustment units 200 to transmit the light. Then, when the brightness of the outside is less than the reference, the control illustrated in FIG. 6 may be performed. In this case, the control unit 300 may determine the brightness of the outside based on an output from a sensor which detects the brightness of the outside.

According to this example, the same effect as that of the embodiment is able to be obtained. In addition, it is possible to easily display a picture or a character on the side surface of the structure 400.

Example 3

Figure 7:
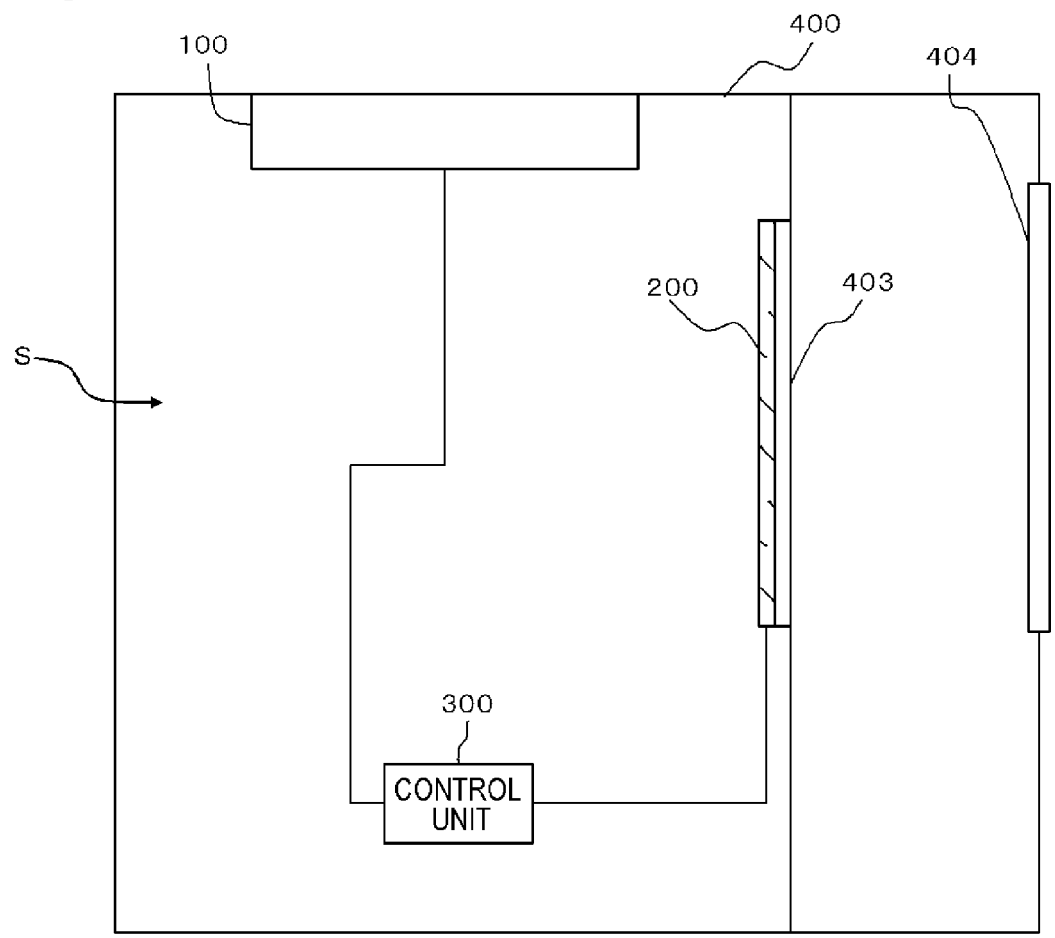
FIG. 7 is a diagram illustrating a configuration of a light emitting system according to Example 3.

FIG. 7 is a diagram illustrating a configuration of the light emitting system 10 according to Example 3. In an example of this drawing, the structure 400 is a leading train car or a trailing train car of a train (for example, an electric train), and the space S is a region in which a seat for a passenger is disposed among spaces inside the train car. The light source 100 is disposed on a ceiling of the space S. Then, the light transmission quantity adjustment unit 200 overlaps with a window 403 which partitions the space S from an operating room or a conductor's cabin.

The control unit 300 is mounted inside the structure 400. Then, the control unit 300 flickers the light source 100, for example, at a frequency of higher than or equal to 30 Hz, as with Example 1. Then, the control unit 300 decreases the light transmission quantity of the light transmission quantity adjustment unit 200 at the timing of emitting the light by the light source 100, and increases the light transmission quantity of the light transmission quantity adjustment unit 200 at a timing other than the timing of emitting the light.

For this reason, according to this example, the light from the light source 100 is prevented from being leaked to the outside through the window 403 and a window 404 disposed in front of the driver's seat. For this reason, a driver of a train car travelling in an opposite lane of the structure 400 is not bothered by the light from the light source 100. In addition, the light transmission quantity adjustment unit 200 transmits the light at a timing when the light source 100 is not lit, and thus the passenger in the space S is able to look at the outside scenery through the windows 403 and 404. In addition, when this example is not adopted, it is necessary that the driver lowers the window shade each time when the train car enters a tunnel, but when this example is adopted, it is possible to save the labor thereof. Furthermore, the control unit 300 is able to determine whether or not the train car enters the tunnel, for example, by using a train position determination device such as a GPS or a track circuit. Then, even when an operation of the driver is not performed, the control unit 300 is able to control the On/Off of the light transmission quantity adjustment unit 200.

Example 4

Figure 8:
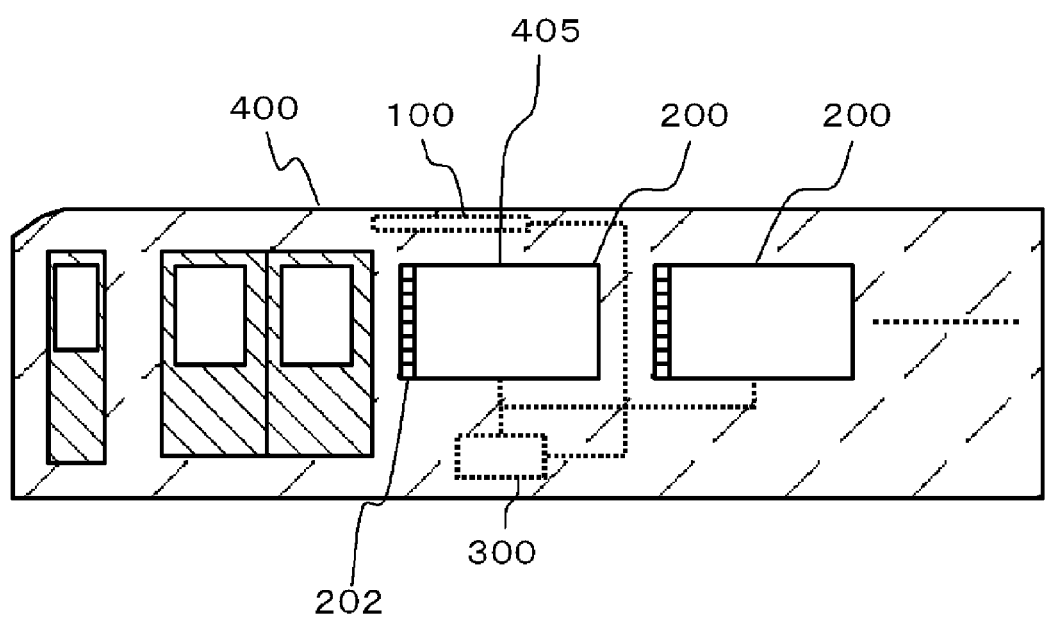
FIG. 8 is a diagram illustrating a configuration of a light emitting system according to Example 4.

FIG. 8 is a diagram illustrating a configuration of the light emitting system 10 according to Example 4. In an example of this drawing, the structure 400 is a train car of a train (for example, an electric train), and the space S is a region in which a seat for a passenger is disposed among spaces inside the train car. The light source 100 is disposed on a ceiling of the space S. Then, the light transmission quantity adjustment unit 200 is attached to each of a plurality of windows 405 which is disposed on a side surface of the train car.

A part of the light transmission quantity adjustment unit 200 is divided into a plurality of regions 202 in a height direction. The region 202 may be disposed in one row with respect to a traveling direction of the structure 400, or may be disposed in a plurality of rows. Then, the control unit 300 is able to control the light transmission quantity for each region 202. In addition, the control unit 300 is mounted inside of the structure 400.

In this example, the control unit 300 controls the plurality of regions 202 included in each of the plurality of light transmission quantity adjustment units 200 according to a movement speed of the train car, that is, the structure 400. Accordingly, the person positioned outside the train car is able to recognize a character or a pattern. In particular, in a case where the region 202 is arranged in one row, when a relative speed of the train car with respect to the person is high (for example, when the train car passes in the vicinity of the person), the person is made to recognize a character or a pattern by using a residual image. In addition, in a case where the region 202 is arranged in a plurality of rows (that is, in a case where the region 202 is arranged in a matrix), when the relative speed of the train car with respect to the person is low (for example, when the train car passes a location far from the person), the person is able to directly recognize a character or a pattern. Furthermore, in any case, the passenger of the train car does not required to recognize the operation of the light transmission quantity adjustment unit 200.

Furthermore, when the plurality of regions 202 is formed in one light transmission quantity adjustment unit 200 in the shape of a matrix, the control unit 300 controls the region 202 in the shape of a matrix, and thus the one light transmission quantity adjustment unit 200 may display a character or a pattern.

As described above, the embodiment and the examples are described with reference to the drawings, but the embodiment and examples are exemplifications of the present invention, and various configurations other than the configuration described above are able to be adopted.

The invention claimed is:
1. A light emitting system, comprising:
a light source;
a light transmission quantity adjustment unit which is arranged with a space from the light source, and adjusts a light transmission quantity; and
a control unit which controls the light transmission quantity adjustment unit based on a timing at which the light source emits light,
wherein, based on the timing at which the light source emits light, the control unit decreases the light transmission quantity of the light transmission quantity adjustment unit from before a start of the timing of emitting the light, so as to prevent leakage of light from the light source.
2. The light emitting system according to claim 1, wherein the space is a space into which a person enters.
3. The light emitting system according to claim 1, wherein the light source is positioned on the inside of a structure which includes the space thereinside, and the light transmission quantity adjustment unit overlaps with a window which is disposed on a wall partitioning the space, or a window which is disposed on a wall partitioning the space of the structure from the outside.
4. The light emitting system according to claim 1, wherein the control unit allows the light transmission quantity of the light transmission quantity adjustment unit when the light source is emitting light to be different from the light transmission quantity of the light transmission quantity adjustment unit when the light source is not emitting light.

5. The light emitting system according to claim 1,
wherein the light transmission quantity adjustment unit includes
two polarization layers, and
a liquid crystal layer which is positioned between the two polarization layers.

6. The light emitting device according to claim 5,
wherein the polarization direction of the two polarization layers are orthogonal each other, and
wherein the control unit controls the polarization direction of the liquid crystal layer so as to control the light transmission quantity.

\* \* \* \* \*